(12) United States Patent
Murakoshi et al.

(10) Patent No.: US 7,272,058 B2
(45) Date of Patent: Sep. 18, 2007

(54) NONVOLATILE SEMICONDUCTOR MEMORY DEVICE HAVING REDUNDANT RELIEF TECHNIQUE

(75) Inventors: Kenichi Murakoshi, Tenri (JP); Yoshinao Morikawa, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/440,733

(22) Filed: May 24, 2006

(65) Prior Publication Data

US 2006/0268635 A1    Nov. 30, 2006

(30) Foreign Application Priority Data

May 27, 2005  (JP)  ............................. 2005-156350
Sep. 16, 2005  (JP)  ............................. 2005-270370

(51) Int. Cl.
*G11C 7/00* (2006.01)
(52) U.S. Cl. ............. 365/200; 365/189.07; 365/185.09
(58) Field of Classification Search ................ 365/200, 365/189.07, 185.09
See application file for complete search history.

(56) References Cited

U.S. PATENT DOCUMENTS 6,298,007 B1 * 10/2001 Santurkar et al. ........ 365/238.5
7,219,271 B2 *  5/2007 Kleveland et al. .......... 714/718

FOREIGN PATENT DOCUMENTS

JP           3-116497 A        5/1991

* cited by examiner

*Primary Examiner*—Tuan T. Nguyen
(74) *Attorney, Agent, or Firm*—Morrison & Foerster LLP

(57) ABSTRACT

A nonvolatile semiconductor memory device including associating means for associating a faulty block with a redundant block, a block switching circuit for selecting the associated redundant block when a memory block is associated with the redundant block, an error detection circuit for detecting an error in an accessing operation to the memory block, a faulty block identification circuit for identifying the memory block having the detected error as a faulty block when the error is detected and associating the faulty block with the redundant block in the case where the redundant block which is not associated with the faulty block exists.

9 Claims, 8 Drawing Sheets

US 7,272,058 B2

NONVOLATILE SEMICONDUCTOR MEMORY DEVICE HAVING REDUNDANT RELIEF TECHNIQUE

CROSS REFERENCE TO RELATED APPLICATIONS

This Nonprovisional application claims priority under 35 U.S.C. §119(a) on Patent Applications No. 2005-156350 and No. 2005-270370 filed in Japan on 27 May 2005 and 16 Sep. 2005 respectively, the entire contents of which are hereby incorporated by reference.

BACKGROUND OF THE INVENTION

1. Field of the Invention

The prevent invention relates to a relief technique of a faulty block containing a faulty memory cell which does not operate normally in a semiconductor memory device, in particular, a redundancy relief technique in a nonvolatile semiconductor memory device.

2. Description of the Related Art

In a recent semiconductor memory device, since yields of memory cells tend to be decreased with increase and complexity in manufacturing processes due to miniaturization and large capacity, to improve the yields of the semiconductor memory device itself, various relief techniques with respect to a memory cell array containing a faulty memory cell which does not operate normally have been proposed. Such relief techniques include a redundancy relief technique in which a redundant block to replace a faulty block containing a faulty memory cell is prepared in a semiconductor memory device in advance and, when the faulty block is detected in total inspection (screening) for failure selection before shipment, the faulty block is replaced with the redundant block.

Here, the above-mentioned redundancy relief technique will be described. FIG. 3 shows a configuration of an NOR-type flash memory cell array in which memory cells 112 formed at intersections between word lines 102 and bit lines 106 are arranged in a matrix form. This memory cell array is configured by a plurality of memory blocks 113 consisting of the plurality of memory cells 112 formed at the intersections between the predetermined number of word lines 102 and the predetermined number of bit lines 106 and replacement with a redundancy block is performed in units of blocks. Specifically, for example, when a faulty memory cell is detected in screening, a faulty block containing the faulty memory cell is identified and a faulty address identifying the faulty block is stored in a faulty memory cell address storage part. In a normal operation, an input address input from the outside of the semiconductor memory device (device) is compared with the faulty address and, when both addresses matches each other, the replaceable redundant block is selected and the selection of the faulty block is prohibited. In this manner, so-called redundancy relief function is realized.

Next, writing and erasure of data to and from a flash memory will be described with reference to FIG. 4. The flash memory writes data thereto by making a threshold voltage of the memory cell higher than a predetermined value through a writing operation and erases data therefrom by making the threshold voltage of the memory cell lower than a predetermined value through an erasing operation. This realizes the storage of data.

More specifically, the writing operation of data to the flash memory is performed by applying 0 V to a source 100, a positive voltage V1 of 5 V, for example, to a drain 101 and a positive voltage V2 of 9 V, for example, to the word line 102. Thus, hot electrons generated by passing a current between the source 100 and the drain 101 are injected into a floating gate 103. As a result, the threshold voltage of the memory cell becomes higher.

Subsequently, the erasing operation of the flash memory will be described in detail with reference to FIG. 5. FIG. 5 is a flowchart showing an example of the erasing operation. First, as an erasure preprocess, a process for preventing excessive erasure of the memory cells is performed on all memory cells in a selected block (step S1). Specifically, a positive voltage V3 of 6 V, for example, which is lower than the positive voltage V2 is applied to the word lines 102 to weakly perform writing in advance.

Subsequently, data is erased from all memory cells in the selected block to lower the threshold voltage of the memory cells (step S2). Specifically, the erasure of data from the flash memory is performed by applying a negative voltage V4 of −8 V, for example, to the word lines 102 and a positive voltage V5 of 8 V, for example, to a P-type region 104. Thus, electrons in the floating gate 103 moves to the P-type region 104 and the threshold voltage of the memory cells becomes lower. Generally, since the P-type region 104 is commonly owned in the above-mentioned units of blocks, data is collectively erased from all memory cells in the memory block.

Subsequently, a comparison circuit such as a sense amplifier converts the threshold voltage of the memory cells into a current and compares the converted current with a reference current in magnitude (step S3). Here, when the threshold voltage of the memory cells is lower than a predetermined reference voltage, it is determined as Pass and in the other case, it is determined as Fail. Then, until it is determined as Pass in erasure verification in step S3, erasure in step S2 is repeated. If it is determined as Fail in step S3, the number of Fail determinations (the number of erasures in step S2) is calculated and it is determined whether or not the number of erasures is equal to or smaller than a prescribed number (step S4). When the number of erasures exceeds the prescribed number for any reason, it is determined as abnormal erasure, that is, inerasable. Furthermore, an abnormal completion signal indicating that the erasing operation has not normally completed is output to the outside of the device and the erasing operation is finished. If it is determined as Pass in step S3, as an erasure postprocess, a positive voltage V6 of 3 V, for example, which is lower than the positive voltage V2 is applied to the word lines 102, thereby weakly writing to excessively erased memory cells (step S5) and the erasing operation is finished.

Here, for example, in generally known flash memories, in particular, NOR-type flash memories, progressive failure cannot be completely detected in conventional screening, for example, in a shipment test including repeated accessing operations to the memory cell array such as the erasing operations and the writing operations.

The progressive failure will be described in detail with reference to FIG. 4. Since a PN junction diode is formed between the P-type region 104 and the N-type drain 101 in the flash memory shown in FIG. 4, a forward voltage is applied at the erasing operation. Furthermore, by applying a positive voltage lower than the high voltage V5 applied to the P-type region 104 by about 0.8 V, for example, to a contact region 105, a high electric field generates a strong electric field stress between the word line 102 and the contact 105. Therefore, an insulating film between the word line 102 and the contact 105, manufactured to be thin through miniaturization, could be deteriorated during the repeated erasing operations. Depending on the deterioration state of the insulating film, a short or current leakage occurs between the word line 102 and the contact 105 and thus a desired voltage cannot be applied to the word line 102 and the P-type region 104 at the erasing operation. As a result, there may cause a problem that time for the erasing operation of the memory cells is extended or erasure cannot be carried out. Furthermore, since the erasing operation is performed in units of blocks, when failure occurs in any memory cell in the memory block, the whole memory blocks containing the faulty memory cell are regarded as a faulty block.

Conventionally, to detect the progressive failure more satisfactorily, an accelerated test is carried out at the screening and E/W (erasure/writing) is repeatedly performed.

The accelerated test for the progressive failure will be described with reference to FIG. 6. As shown in FIG. 6, the NOR-type flash memory is configured so that a plurality of memory cells are connected to a bit line 106 in parallel. The accelerated test for the progressive failure is carried out as follows. A negative voltage V7 further lower than the negative voltage V4 is applied to the word line of each memory cell and a positive voltage V8 further higher than positive voltage V5 is applied to the P-type region 104, thereby applying larger electric field stress than that at the normal erasing operation between the word line 102 and the contact 105. Thus, the occurrence of the progressive failure is physically accelerated.

However, when the negative voltage V7 is too low or the positive voltage V8 is too high, in some cases, there is a possibility that the memory cell falls into the excessive erasure state. In addition, since the erasing operation is performed in units of blocks, there is a possibility that a plurality of memory cells on the same bit line 106 (a memory cell A107, a memory cell B108, a memory cell C109, etc.) fall into the excessive erasure state. For example, when weak writing to the memory cell A107 on the bit line 106 in the erasure postprocess, since the memory cells other than memory cell A107 are brought into an unselected state, 0 V is applied to the word line 110, the line 111, etc. At this time, the threshold voltage of the memory cell in the excessive erasure state is a low value such as 0.5 V. For this reason, in the state where a large number of memory cells in the excessive erasure state exist on the bit line 106, overall leakage current becomes large and the voltage at the bit lines 106 is lowered. Furthermore, since a potential difference between the source 100 and the drain 101 becomes small, a current passing between the source 100 and the drain 101 is reduced, resulting in that the hot electrons required for the writing to the memory cell A107 are reduced or do not occur. Therefore, since there is a possibility that the writing to the memory cells may not be performed when the negative voltage V7 is too low or the positive voltage V8 is too high, an electric field stress to be applied is limited. In consideration of these circumstances, disadvantageously it is difficult to carry out the accelerated test for the progressive failure in a short time.

Moreover, when E/W is repeatedly performed at the screening, it takes a long time to perform the E/W in the flash memory and thus the time for screening becomes longer.

Furthermore, even when the above-mentioned screening before shipment of the device is carried out, it is difficult to completely eliminate the progressive failure. Thus, failure may occur due to repeated E/W in normal operations after shipment of the device.

On the contrary, as a technique relating to measures against the progressive failure, for example, JP-A 03-116497 (1991) discloses a semiconductor memory device having a self-test circuit for testing all memory cells in a memory cell array and detecting a faulty memory cell region containing a faulty memory cell, in which in the case where there is an available redundant memory region, when a faulty memory region detected by the self-test circuit is selected, the redundant memory region is selected. Even after shipment of the device, this semiconductor memory device can replace the faulty memory region with the redundant memory region at the power-on or at the input of a control signal.

However, since the semiconductor memory device described in JP-A 03-116497 (1991) has the configuration of testing all memory cells in the memory cell array, when it is applied to the flash memory with long E/W time, it disadvantageously takes a long time to carry out the self-test. In recent years, the capacity of the flash memory tends to be increased and with the increase in the capacity, the time for the self-test has also increased remarkably. Specifically, when all memory cells are diagnosed as normal/faulty each at the power-on or at the input of the control signal and the faulty memory cell is replaced with the redundant memory cell on all such occasions, the time required until the device becomes available, for example, the device can execute a first data reading operation, becomes longer. Moreover, since the faulty memory cell is detected in the self-test at the power-on or at the input of the control signal, when progressive failure occurs during the erasing operation, disadvantageously, redundancy relief cannot apply to the faulty memory cell with progressive failure.

SUMMARY OF THE INVENTION

In consideration of the above-mentioned problems, an object of the present invention is to provide a nonvolatile semiconductor memory device capable of relieving a faulty block by associating the faulty block with a redundant block when progressive failure occurs after shipment of the device to extend the life of the device without increasing the time necessary for screening.

To achieve the above-mentioned object, a nonvolatile semiconductor memory device according to the present invention comprises: a memory cell array including a plurality of memory blocks which are arranged in an array form and can collectively erase data stored therein and a redundant block having memory cells not less than memory cells in one of the memory blocks; associating means for associating a faulty block containing a faulty memory cell with the redundant block; and a block switching circuit for selecting the associated redundant block when the memory block identified by an input address is associated with the redundant block by the associating means. Herein, the nonvolatile semiconductor memory device further comprises: an error detection circuit for detecting an error in an accessing operation to the memory block; and a faulty block identification circuit for identifying the memory block having the detected error as a faulty block when the error is detected by the error detection circuit. When the error is detected by the error detection circuit, in the case where the redundant block which is not associated with the faulty block exists, the faulty block identification circuit associates the faulty block having the detected error with the redundant block.

In the nonvolatile semiconductor memory device according to the present invention, in an erasing operation to the predetermined memory block in the memory cell array, when data erasure of the memory block is not completed by a prescribed number of times of the erasing operation, the error detection circuit detects an occurrence of an error.

In the nonvolatile semiconductor memory device according to the present invention, when the error is detected by the error detection circuit after shipment and it is determined that the redundant block which is not associated with the faulty block exists, the faulty block identification circuit associates the faulty block having the detected error with the redundant block and outputs a normal operation completion signal.

The nonvolatile semiconductor memory device according to the present invention further comprises storage means for storing a faulty address identifying the faulty block therein. When the error is detected by the error detection circuit, the faulty block identification circuit stores the faulty address identifying the memory block having the detected error in the storage means.

In the nonvolatile semiconductor memory device according to the present invention, when the faulty address is stored in the storage means, the faulty block identification circuit determines whether or not the faulty address is normally stored.

In the nonvolatile semiconductor memory device according to the present invention, the faulty block identification circuit further sets a result of the above-mentioned determination of whether or not the faulty address is normally stored to a writing determination flag associated with the faulty address.

Furthermore, in the nonvolatile semiconductor memory device according to the present invention, when the writing determination flag indicates that the faulty address is normally stored, the associating means associates the faulty block with the redundant block.

Furthermore, in the nonvolatile semiconductor memory device according to the present invention, the storage means is formed of flash memory cells.

Furthermore, in the nonvolatile semiconductor memory device according to the present invention, the memory cell array is formed of flash memory cells.

In the nonvolatile semiconductor memory device according to the present invention, when the error is detected by the error detection circuit, if the redundant block which is not associated with the faulty block exists, the faulty block identification circuit associates the faulty block having the detected error with the redundant block. Thus, if the redundant block which is not associated with the faulty block exists, the faulty block with progressive failure or the like can be replaced with the redundant block. Since it is possible to address progressive failure after shipment of the device, the number of times of the accelerated test and E/W for detecting progressive failure in screening can be reduced, thereby shortening the time for screening. Furthermore, when progressive failure occurs in E/W in the normal operation, if the unused redundant block exists, it is possible to perform redundancy relief of the faulty block containing the faulty memory cell with progressive failure.

Furthermore, in the device according to the present invention, the error detection circuit is configured to detect the error occurred in the erasing operation. Thus, since the erasing operation is performed prior to the writing operation in the nonvolatile semiconductor memory device, the faulty memory cell can be satisfactorily detected. Furthermore, in the device according to the present invention, when the faulty memory cell occurs in the erasing operation after shipment of the device, the faulty block containing the faulty memory cell is associated with the redundant block prepared in advance. Thus, if the faulty address of the faulty block detected by the error detection circuit is input since then, the faulty block can be automatically replaced with the redundant block. For this reason, the device according to the present invention can perform redundancy relief of progressive failure in the device.

Furthermore, when the memory cell array of the device according to the present invention is formed of the flash memory cells, since the general flash memory is configured to detect an error in the accessing operation such as erasure or writing using a predetermined algorism, the error detection circuit generally provided in the flash memory cell can be used. Thus, it is possible to simplify the configuration of the device according to the present invention and easily manufacture the device.

According to the present invention, the error detection circuit for detecting an error in the accessing operation to the memory block is provided and only when the erasure faulty block occurs in the memory cell array, redundancy relief of the faulty block is performed. Thus, since it is unnecessary to determine whether or not all memory blocks in the memory cell array are the faulty block, the present invention can be applied to a large-capacity flash memory having a long E/W time. Therefore, in the nonvolatile semiconductor memory device according to the present invention, even when progressive failure occurs in the erasing operation after shipment of the device, the failure can be relieved and the life of the device can be extended. Furthermore, the number of times of the accelerated test and E/W for detecting progressive failure in screening can be reduced, thereby shortening the time for screening.

Furthermore, with the configuration of determining whether or not the faulty address of the faulty block is normally stored in the storage means, for example, even when power drop, power shutoff, a reset signal or the like occurs during the writing operation for storing the faulty address and the operation is forcibly terminated, suitable response is possible. In such case, there is a possibility that the faulty address which is not correctly stored corresponds to the normal block address. However, with the configuration of the present invention, it is possible to prevent the block address of the normal memory block from associating with the address of the redundant block, thereby preventing any possible fault, for example, loss of data in the normal memory block.

DETAILED DESCRIPTION OF THE INVENTION

Embodiments of a nonvolatile semiconductor memory device according to the present invention (hereinafter, appropriately abbreviated to "the inventive device") will be described with reference to the drawings.

First Embodiment

First, a configuration of the inventive device will be described with reference to FIG. 1. In this embodiment, description is made to a case where the occurrence of progressive failure is detected by detecting an error in an erasing operation and redundancy relief of a faulty block containing a faulty memory cell is performed. In the nonvolatile semiconductor memory device, when a writing operation is performed, all memory cells in memory blocks 15a are erased. Thus, by detecting an error in the erasing operation, the faulty memory cell can be satisfactorily detected.

Figure 1:
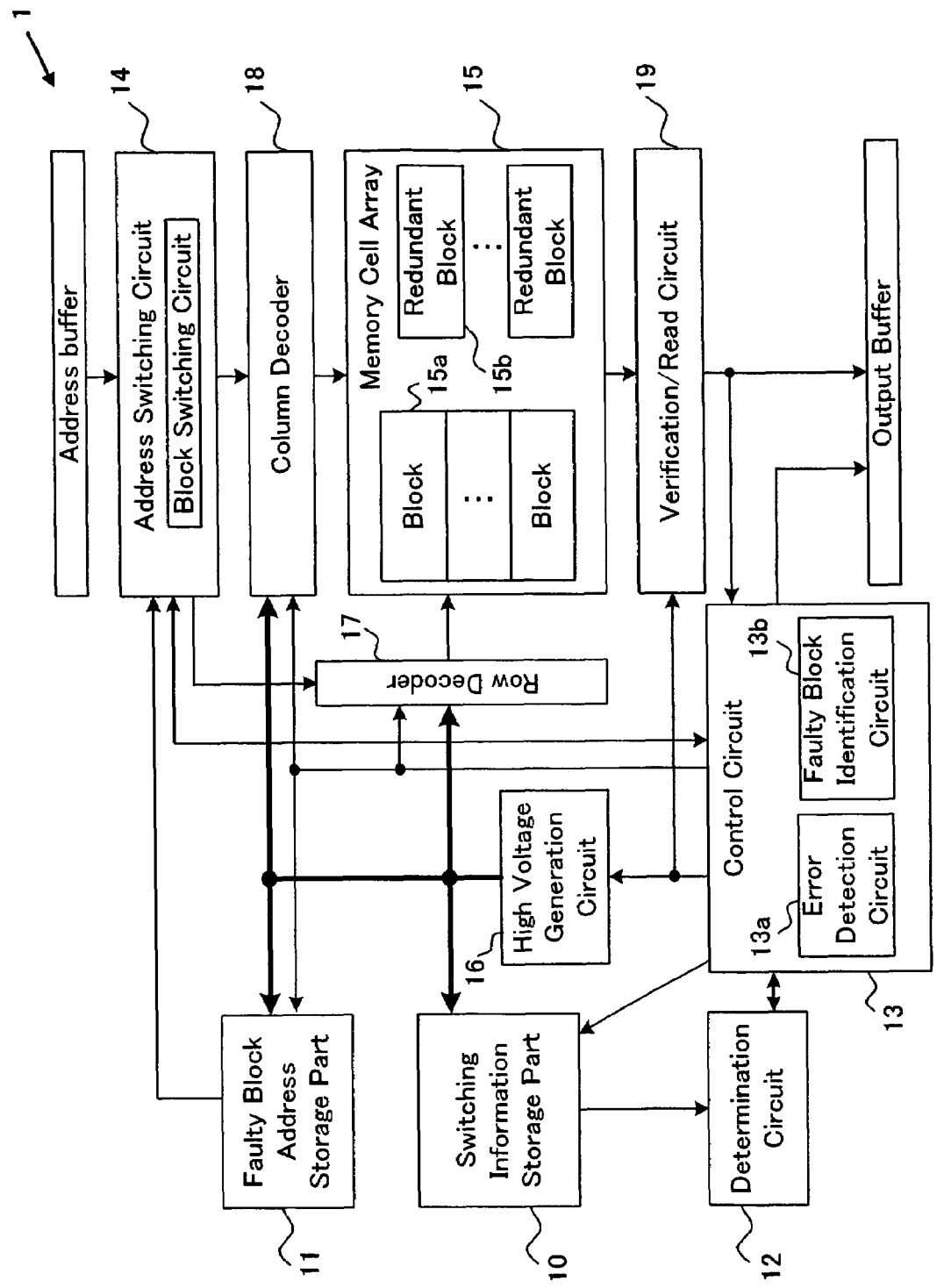
FIG. 1 is a block diagram showing a schematic configuration of a nonvolatile semiconductor memory device according to the present invention.

FIG. 1 is a functional block diagram of the inventive device 1. As shown in FIG. 1, the inventive device 1 has a memory cell array 15, a faulty block address storage part 11, an address switching circuit 14, a high voltage generation circuit 16, a determination circuit 12 and a control circuit 13. Bold lines in FIG. 1 show a high voltage system.

Figure 4:
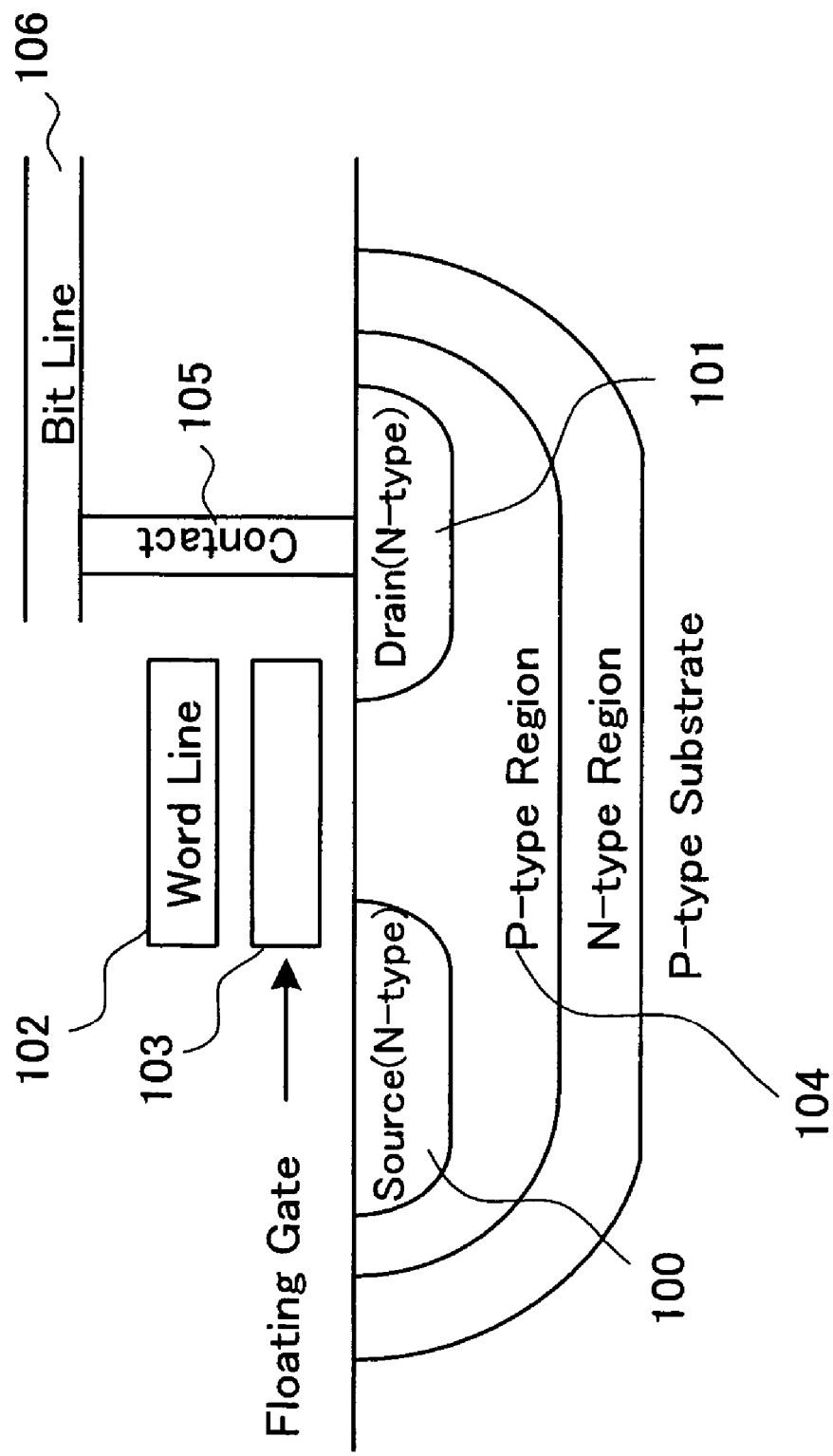
FIG. 4 is a sectional view of a flash memory cell according to the conventional technique.
Figure 5:
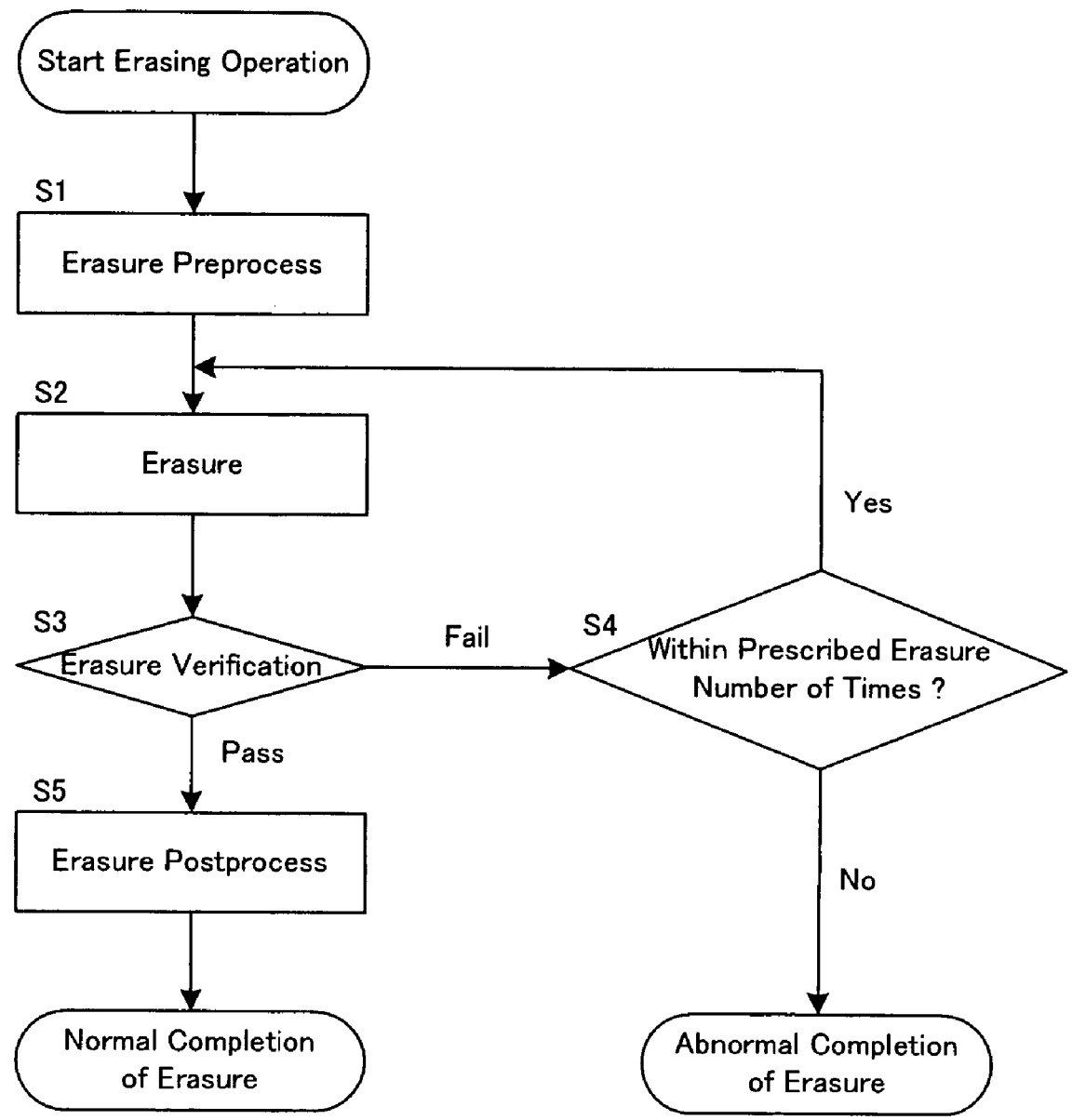
FIG. 5 is a flowchart showing a processing procedure of an erasing operation of the flash memory according to the conventional technique.
Figure 6:
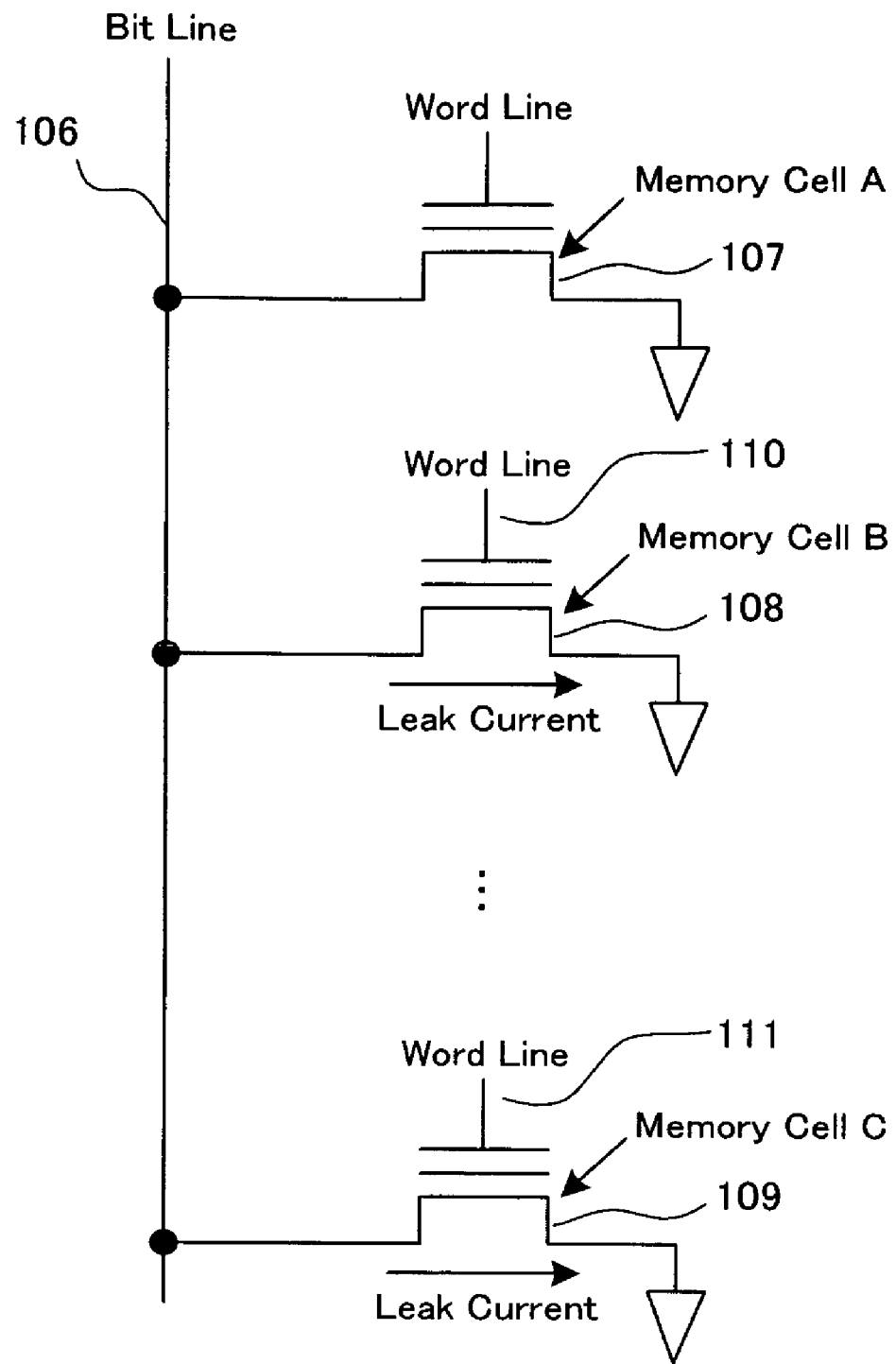
FIG. 6 is a schematic configuration view showing an NOR-type flash memory according to the conventional technique.

The memory cell array 15 is configured by a plurality of memory blocks 15a in which memory cells are arranged in an array form and data stored therein can be collectively erased, and redundant blocks 15b having memory cells not less than the memory cells in one of the memory blocks 15a. The inventive device 1 further has a column decoder 18 and a row decoder 17. The memory cell array 15 in this embodiment has the plurality of redundant blocks 15b and the size of each memory block 15a is the same as that of each redundant block 15b. The memory cells in the redundant blocks 15b are erased before shipment of the device. Each of the memory blocks 15a and redundant blocks 15b of the memory cell array 15 in this embodiment is formed of, for example, flash memory cells with a floating gate structure shown in FIG. 4, which are arranged in an array form.

The faulty block address storage part 11 stores a faulty address for identifying a faulty block (faulty block address) therein. Like the memory cell array 15, the faulty block address storage part 11 in this embodiment is formed of flash memory cells. More specifically, for example, each faulty address of the faulty block detected by screening or the like is associated with the redundant block 15b used for block redundancy relief and stored in the faulty block address storage part 11 before shipment. In this embodiment, the faulty block address storage part 11 functions as an associating means for associating the faulty block containing the faulty memory cell with the redundant block.

When the memory block 15a identified by the input address is a faulty block, the address switching circuit 14 replaces the faulty block with the redundant block 15b. Specifically, the address switching circuit 14 in this embodiment functions as a block switching circuit. When the memory block 15a identified by the input address is associated with the redundant block 15b in the faulty block address storage part 11, the address switching circuit 14 selects the associated redundant block 15b.

More specifically, the address switching circuit 14 in this embodiment has an internal register for storing the input address input from the outside therein and when an address is input from the outside, the address switching circuit 14 compares the input address stored in the internal register with the faulty address stored in the faulty block address storage part 11. When the input address corresponds to the faulty address associated with the redundant address, the address switching circuit 14 switches the input address as the faulty address to the redundant address and accesses the redundant block 15b identified by the redundant address.

The determination circuit 12 determines whether or not there is the redundant block 15b which is not associated with the faulty block. Specifically, a prescribed erasure number over signal indicating that the number of times the memory block 15a identified by the input address is erased exceeds a prescribed number of times is output from the control circuit 13, the determination circuit 12 reads data in a nonvolatile switching information storage part 10 for storing information on whether or not the faulty block can be replaced with the redundant block 15b. Thus, the determination circuit 12 determines whether or not there is the redundant block 15b which is not associated with the faulty block, thereby determining the feasibility of relief of the faulty block. When there is the redundant block 15b which is not associated with the faulty block, the determination circuit 12 determines that relief of the faulty block is possible and outputs a faulty block relievable signal to the control circuit 13.

The control circuit 13 controls an accessing operation such as erasing operation, writing operation or reading operation with respect to the memory block 15a and the redundant block 15b on the basis of a predetermined algorism and is formed using a state machine, for example. Furthermore, the control circuit 13 in this embodiment detects an error in the accessing operation to the memory block 15a and performs redundancy relief of the faulty block containing the detected error. Specifically, the control circuit 13 has an error detection circuit 13a and a faulty block identification circuit 13b.

In this embodiment, in the erasing operation to the predetermined memory block 15a in the memory cell array 15, when data in the memory block 15a cannot be erased in a predetermined number of times of the erasing operation, the error detection circuit 13a detects the occurrence of an error. Furthermore, upon detection of the occurrence of the error, the error detection circuit 13a outputs a prescribed erasure number over signal to the determination circuit 12.

When the error is detected by the error detection circuit 13a, the faulty block identification circuit 13b identifies the memory block 15a having the detected error as a faulty block. When the error detection circuit 13a detects the error after shipment and it is determined that there is the redundant block 15b which is not associated with the faulty block, the faulty block identification circuit 13b in this embodiment associates the faulty block having the detected error with the redundant block 15b and outputs a normal operation completion signal. Furthermore, the faulty block identification circuit 13b stores the faulty address for identifying the memory block 15a having the detected error in the faulty block address storage part 11.

Specifically, when the prescribed erasure number over signal is output from the error detection circuit 13a, the faulty block identification circuit 13b stores the input address stored in the internal register of the address switching circuit 14 in the faulty block address storage part 11 as the faulty address. Furthermore, when the faulty block relievable signal is output from the determination circuit 12, the faulty block identification circuit 13b associates the faulty address of the faulty block with the redundant address of the redundant block 15b. Then, the faulty block identification circuit 13b stores a use flag concerning the redundant block 15b associated with the faulty block in the switching information storage part 10. The writing of the faulty address to the faulty block address storage part 11 and the writing of the redundant block 15b use flag to the switching information storage part 10 are performed by outputting an operating trigger signal to the high voltage generation circuit 16.

Figure 2:
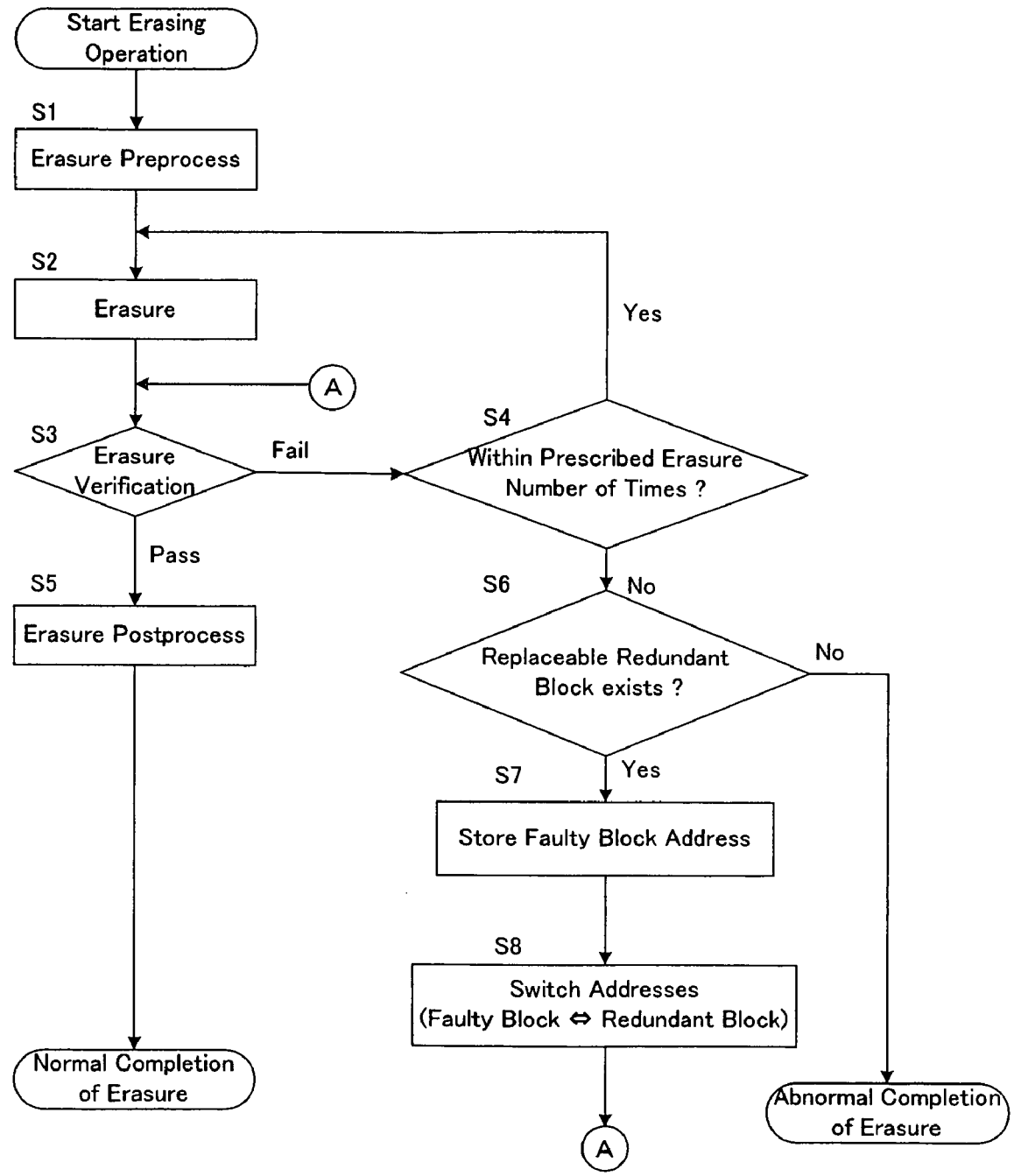
FIG. 2 is a flowchart showing a processing procedure of an erasing operation of the nonvolatile semiconductor memory device according to the present invention.
Figure 3:
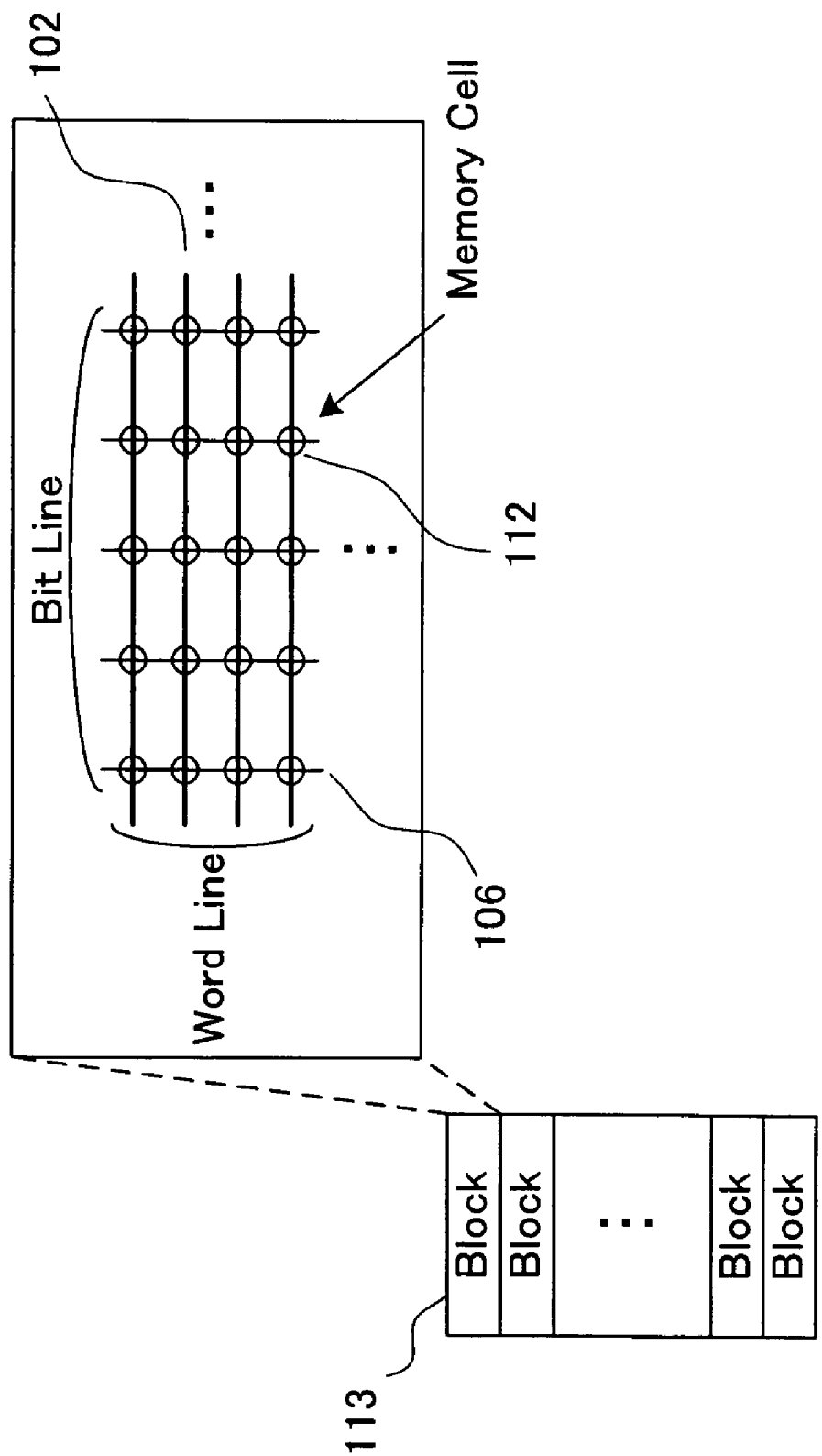
FIG. 3 is a block diagram showing a schematic configuration of a flash memory according to a conventional technique.

Next, operations of the inventive device 1 will be described with reference to a flowchart of FIG. 2. Since processes in steps S1 to S4 are similar to those in the erasing operation according to the conventional technique, the outline thereof will be described below.

At the start of an erasing operation, to prevent excessive erasure, first, the control circuit 13 performs an erasure preprocess of weakly writing to the selected memory block 15a, that is, the memory block 15a identified by the input address (step S1). Subsequently, the control circuit 13 performs the erasing operation on the selected memory block 15a (step S2). Subsequently, a verification/read circuit 19 performs an erasure verifying process for checking whether or not the erasure to the memory block 15a has been correctly performed (step S3). The control circuit 13 determines whether or not the number of times of the erasure verifying process is within a prescribed number of times (step S4). If it is determined that the erasing operation has been normally performed in step S4, the control circuit 13 performs an erasure postprocess of weakly writing to the memory cell excessively erased (step S5) and outputs a normal operation completion signal.

If it is determined that the number of times of the erasure verifying process exceeds the prescribed number of times in step S4, the control circuit 13 determines that an error occurs in the accessing operation to the memory block 15a and outputs the prescribed erasure number over signal to the determination circuit 12. Upon reception of the prescribed erasure number over signal, the determination circuit 12 accesses the switching information storage part 10 and determines whether or not the redundant block 15b which is not associated with the faulty block, that is, an unused redundant block 15b exists (step S6). Specifically, a storage region where a use/non-use flag is set for each redundant block 15b is provided in the switching information storage part 10 and, if the redundant block 15b for which the non-use flag is set exists, the determination circuit 12 determines that the unused redundant block 15b exists. If it is determined that the unused redundant block 15b exists, the faulty block identification circuit 13b outputs the faulty block relievable signal to the control circuit 13 as a determination result. If it is determined that no unused redundant block 15b exists, the faulty block identification circuit 13b outputs the faulty block unrelievable signal to the control circuit 13 as a determination result.

If it is determined that the unused redundant block 15b exists and the faulty block relievable signal is output from the determination circuit 12 in step S6, the control circuit 13 accesses the address switching circuit 14 to read the input address and stores the input address in the faulty block address storage part 11 as a faulty address (step S7). Specifically, the control circuit 13 reads the input address stored in the internal register of the address switching circuit 14 and temporarily stores the input address in the internal register of the control circuit 13 as the faulty address. Then, the control circuit 13 outputs an operating trigger signal to the high voltage generation circuit 16. The high voltage generation circuit 16 writes the faulty address to the faulty block address storage part 11 by generating a positive voltage V1 applied to drains of the predetermined memory cells and a positive voltage V2 applied to word lines on the basis of the faulty address stored in the internal register of the control circuit 13. When the faulty address is written, the control circuit 13 outputs a faulty address writing completion signal to the address switching circuit 14. Furthermore, the control circuit 13 associates the memory block 15a identified by the input address with the unused redundant block 15b. Furthermore, the control circuit 13 accesses the switching information storage part 10 and sets the use flag for the redundant block 15b associated with the faulty block.

Subsequently, the address switching circuit 14 switches the input address stored in the internal register to the redundant address (step S8). Specifically, when the faulty address writing completion signal is output from the control circuit 13, the address switching circuit 14 accesses the faulty block address storage part 11 and reads the redundant address of the redundant block 15b, which is associated with the input address. Then, the read redundant address is overwritten to the internal register, so that the stored input address is switched to the read redundant address. Furthermore, the address switching circuit 14 outputs a redundant row address to the row decoder 17 and a redundant column address to the column decoder 18 to select the redundant block 15b. After that, the address switching circuit 14 outputs the operating trigger signal to the control circuit 13.

Subsequently, based on the operating trigger signal output from the address switching circuit 14, the control circuit 13 outputs an erasure verification signal to the verification/read circuit 19. Then, the verification/read circuit 19 performs an erasure verifying process in response to the erasure verification signal (step S3). Since the redundant block 15b is erased in advance, it is determined that the erasing operation has been normally performed and the verification result is Pass. If it is determined that the verification result is Pass (Pass in step S3), the control circuit 13 performs an erasure postprocess (step S5). Furthermore, the control circuit 13 sets an erasing operation normal completion flag at the internal register and terminates the erasing operation. When a device operating state confirmation signal is input to the device from a CPU or the like outside of the device, the control circuit 13 outputs the erasing operation normal completion signal to the CPU or the like outside of the device.

If it is determined that no unused redundant block 15b exists and the faulty block unrelievable signal is output from the determination circuit 12 in step S6, the control circuit 13 sets an erasing operation abnormal completion flag at the internal register and terminates the erasing operation. In this case, when the device operating state confirmation signal is input to the device from the CPU or the like outside of the device, the control circuit 13 outputs an erasing operation abnormal completion signal indicating that the erasure operation is not normally completed.

Normal accessing operations of the inventive device 1 to the memory cell array 15 will be described.

When an access request to a certain memory block 15a of the memory cell array 15 is issued from the outside, the address switching circuit 14 compares the input address input from the outside with the faulty address stored in the faulty block address storage part 11. If the input address corresponds to the faulty address, when the faulty block identified by the faulty address is associated with a redundant block 15b, the address switching circuit 14 accesses the associated redundant block 15b. Since the inventive device 1 is configured so that the faulty block address storage part 11 stores the faulty block detected by screening before shipment and the faulty address of the faulty block identified by the control circuit 13, access to the faulty block can be properly limited.

As described above, even if the number of times that the memory cells are erased exceeds the prescribed number of times in step S4, when the unused redundant block 15b exists, the inventive device 1 in this embodiment can replace the faulty block with the redundant block 15b and relieve the faulty block by performing the processes in steps S6 to S8. Then, if the erasure verifying process in step S3 and the erasure postprocess in step S5 are performed on the replaced redundant block 15b and it is determined that the redundant block 15b is normally erased, the erasing operation is regarded to be normally completed when viewed from the outside of the inventive device 1.

Second Embodiment

Figure 7:
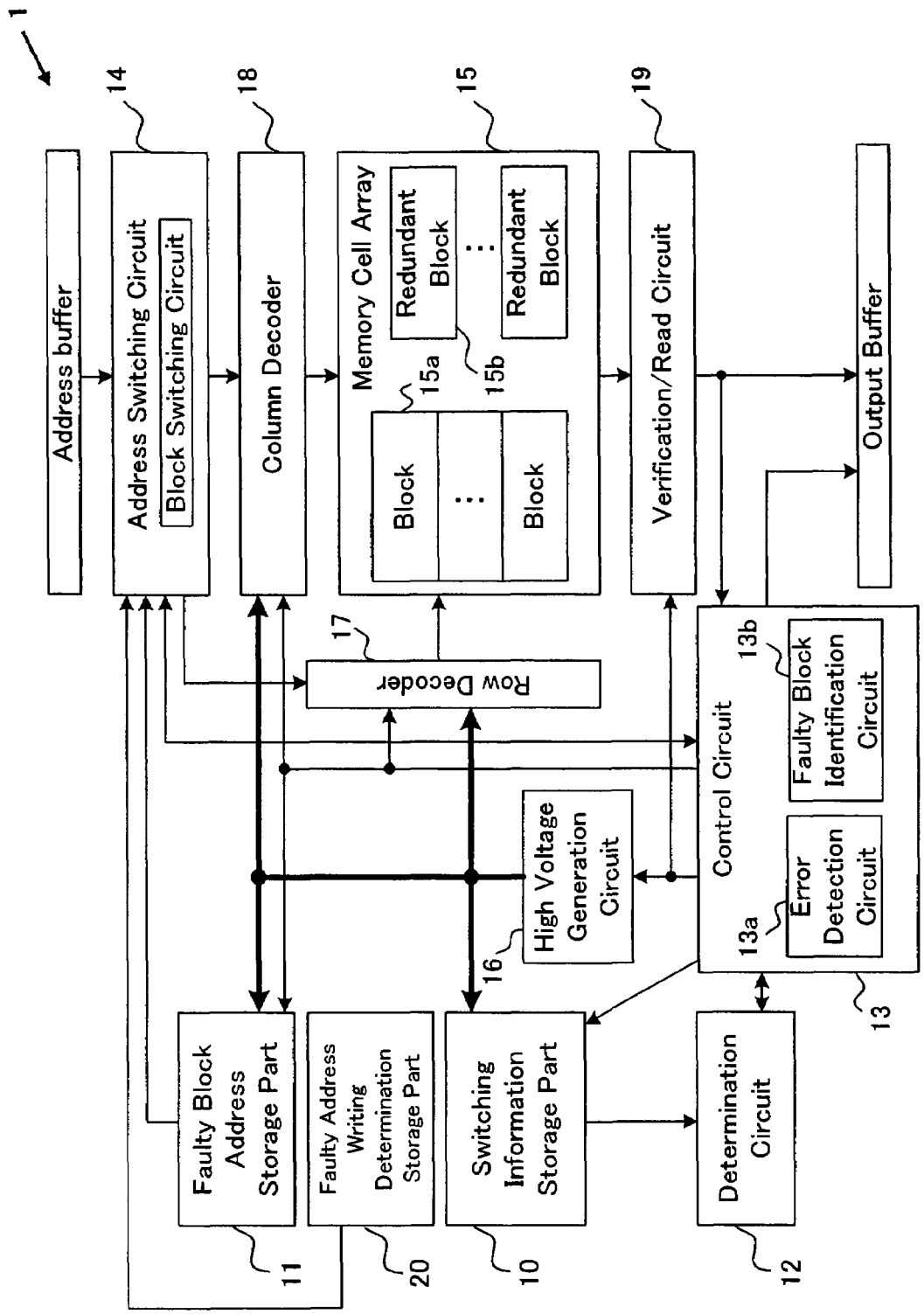
FIG. 7 is a block diagram showing a schematic configuration of a nonvolatile semiconductor memory device in accordance with another embodiment of the present invention.

Next, a second embodiment of the inventive device will be described with reference to FIGS. 7 and 8. As shown in FIG. 7, the inventive device in this embodiment is configured to have a faulty address writing determination storage part 20 in addition to the respective components of the above-mentioned embodiment.

The faulty address writing determination storage part 20 in this embodiment is prepared for each redundant block. When a plurality of replaceable redundant block exist, processes in step S7 and subsequent thereto are performed plural times and a writing normal flag is set individually for each process.

When the faulty address is stored in the faulty block address storage part 11, the faulty block identification circuit 13b in this embodiment determines whether or not the faulty address is normally stored. If it is determined that the faulty address is normally stored, the faulty address writing determination storage part 20 stores the writing normal flag indicating that the faulty address is normally stored therein. This flag of 1 bit exists at each faulty address.

Next, a writing sequence to the faulty address writing determination storage part will be described with reference to a flowchart of FIG. 8. The processes in steps S1 to S7 and S8 in FIG. 8 are the same as those in the above-mentioned embodiment, description thereof is omitted here.

Figure 8:
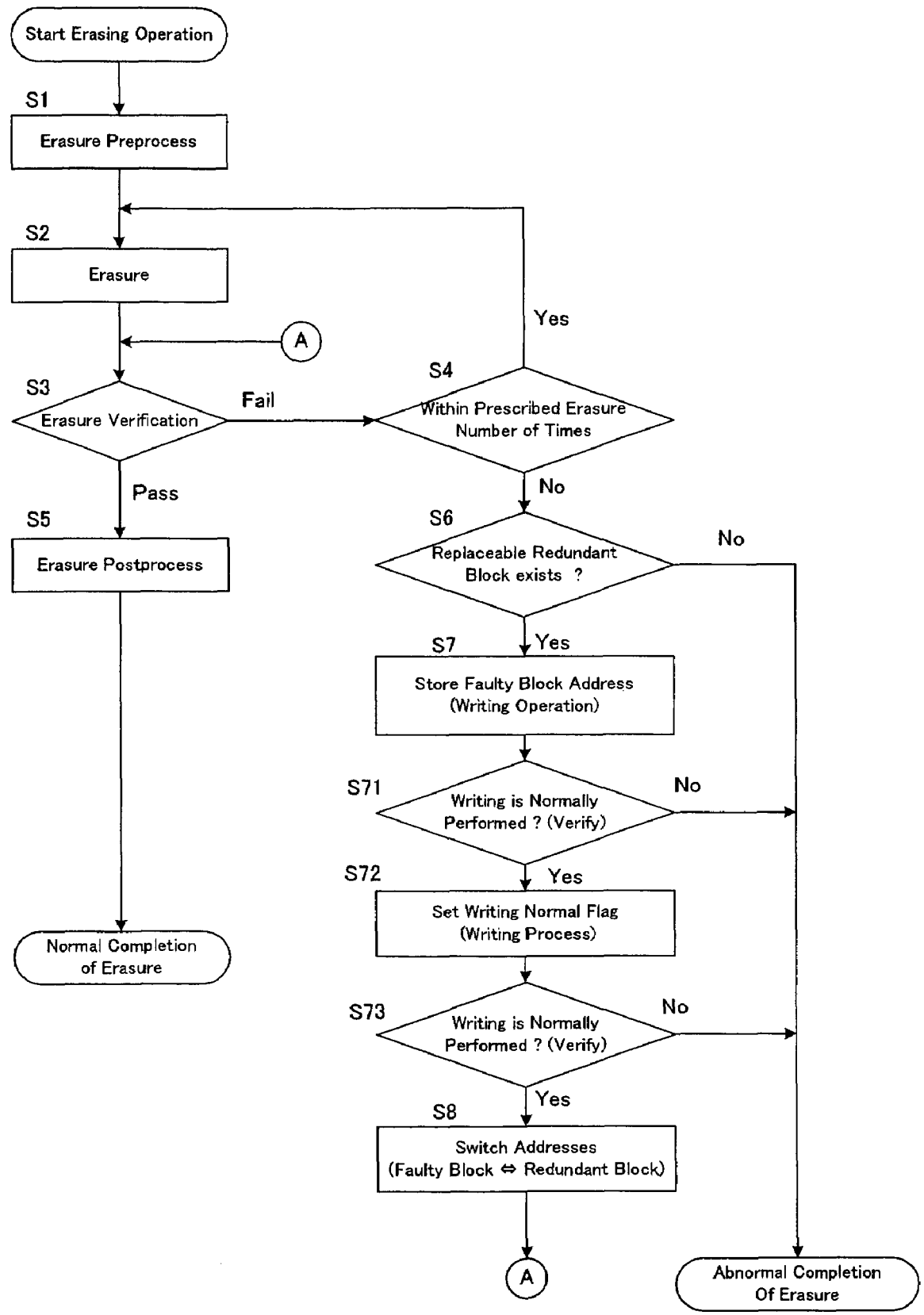
FIG. 8 is a flowchart showing a processing procedure of an erasing operation of the nonvolatile semiconductor memory device in accordance with another embodiment of the present invention.

After the writing process of the faulty address to the faulty block address storage part 11 is performed in step S7 of FIG. 8, the faulty block identification circuit 13b performs a verifying process for determining whether or not the writing process is normally performed (step S71). If it is determined that writing is not normally performed in the verifying process (No in step S71), the operation proceeds to erasure abnormal end. Alternatively, it may be configured as follows. If it is determined that writing is not normally performed in the verifying process, the writing process of storing the faulty address in the faulty block address storage part 11 is performed. If it is determined that writing is not normally performed in the verifying process even in the case where the number of times of the writing process exceeds the prescribed number of repeating times, the operation proceeds to the erasure abnormal end.

If it is determined that the faulty address is normally stored in step S71 (Yes in step S71), the faulty address writing determination storage part 20 shown in FIG. 7 performs a process for setting the writing normal flag (step S72). Here, the verifying process of determining whether or not the writing normal flag is correctly written is performed (step S73). If it is determined that the writing normal flag is correctly written (Yes in step S73), the operation proceeds to step S8 and if it is determined that the writing normal flag is not normally written (No in step S73), the operation proceeds to the erasure abnormal end. Alternatively, it may be configured as follows. If it is determined that writing is not normally performed in the verifying process, the process for setting the writing normal flag again is performed. If it is determined that writing is not normally performed in the verifying process even in the case where the number of times of the writing process exceeds the prescribed number of repeating times, the operation proceeds to the erasure abnormal end.

Subsequently, the normal accessing operation to the memory cell array of the inventive device 1 in this embodiment will be described.

When the faulty address at which the writing normal flag is set exists, the faulty address writing determination storage part 20 outputs a writing normal operation signal. When an access request is issued to a certain memory block 15a in the memory cell array 15, only in the case where at least one writing normal operation signal is output, the address switching circuit 14 sequentially or in parallel compares the faulty address at which the writing normal flag is set with the input address input from the outside. The case where the writing normal operation signal is not output corresponds to the case where no replaced memory block exists or the case where the faulty address is not normally written. Thus, since there is no need to exchange addresses, unnecessary comparing operation is not performed. When the faulty address stored in the faulty block address storage part 11 corresponds to the input address input from the outside, the address switching circuit 14 replaces the block address of the memory block identified by the input address with the associated redundant address.

With such configuration in this embodiment, even when power drop, power shutoff, a reset signal or the like occurs during the writing operation for storing the faulty address and the operation is forcibly terminated, and thus the faulty address is not correctly stored, it is possible to prevent the block address of the normal memory block from associating with the address of the redundant block, thereby preventing any fault, for example, loss of data in the normal memory block.

Other Embodiments

Next, other embodiments of the inventive device 1 will be described.

(1) Although each memory block 15a and each redundant block 15b are same as each other in configuration (the number of memory cells) in the above-mentioned embodiments, the present invention is not limited thereto. The present invention can be applied to a nonvolatile semiconductor memory device having the memory block 15a with plural types of configurations. The number of memory cells in the redundant block 15b only needs to be equal to or greater than the number of memory cells in the memory block 15*a*, and is not necessarily the same as the number of memory cells in each redundant block 15*b*.

(2) Although the occurrence of progressive failure is detected by detecting an error in the erasing operation in each of the above-mentioned embodiments, the present invention is not limited thereto. The error detection circuit 13*a* may be configured so as to detect an error to relieve the faulty block even when the writing operation is not normally terminated.

(3) Although the faulty block address storage part 11 stores the redundant addresses for identifying all redundant blocks 15*b* in the memory cell array 15 and the associated faulty address in each of the above-mentioned embodiments, the faulty block address storage part 11 may store the faulty address of the faulty block associated with no redundant block 15*b*.

Furthermore, in this embodiment, when the faulty address of the faulty block associated with no redundant block 15*b* corresponds to the input address in the predetermined accessing operation to the memory cell array 15, an abnormal signal in response to the accessing operation may be output. With this configuration, when the input address is the faulty address, the faulty block can be detected without detecting an error in the accessing operation. Specifically, in the case where an error is detected when the accessing operation is repeatedly performed and the accessing operation is not normally completed within the prescribed number of times, it takes a long time to detect the error. However, in this embodiment, since determination can be made whether or not the input address is the faulty address by comparing the input address with the faulty address stored in the faulty block address storage part 11, the accessing operation of the prescribed number of times is unnecessary and thus the time for error detection can be reduced. Therefore, the present invention is effective for the semiconductor memory device such as a flash memory, in which the time for error detection in the accessing operation is relatively long.

(4) Although the faulty block address storage part 11 is provided and a faulty block is associated with a redundant block in each of the above-mentioned embodiments, the redundant block address storage part 11 is not necessarily provided. For example, a register for storing a flag identifying the faulty block or the associated redundant block therein may be provided in each memory block 15*a*. In the second embodiment, the faulty block identification circuit 13*b* may be configured to determine whether or not the flag identifying the redundant block is normally written and sets the writing normal flag to each flag identifying the redundant block.

(5) Moreover, in each of the above-mentioned embodiments, it is preferred that when the redundant block is the faulty block, the memory block associated with the redundant block is associated with another redundant block.

Although the present invention has been described in terms of the preferred embodiments, it will be appreciated that various modifications and alterations might be made by those skilled in the art without departing from the spirit and scope of the invention. The invention should therefore be measured in terms of the claims which follow.

What is claimed is:

1. A nonvolatile semiconductor memory device comprising:
    a memory cell array including a plurality of memory blocks which are arranged in an array form and can collectively erase data stored therein and a redundant block having memory cells not less than memory cells in one of the memory blocks;
    associating means for associating a faulty block containing a faulty memory cell with the redundant block;
    a block switching circuit for selecting the associated redundant block when the memory block identified by an input address is associated with the redundant block by the associating means;
    an error detection circuit for detecting an error in an accessing operation to the memory block; and
    a faulty block identification circuit for identifying the memory block having the detected error as a faulty block when the error is detected by the error detection circuit, wherein
    when the error is detected by the error detection circuit, in the case where the redundant block which is not associated with the faulty block exists, the faulty block identification circuit associates the faulty block having the detected error with the redundant block.

2. The nonvolatile semiconductor memory device according to claim 1, wherein in an erasing operation to the predetermined memory block in the memory cell array, the error detection circuit detects an occurrence of an error when data erasure of the memory block is not completed by a prescribed number of times of the erasing operation.

3. The nonvolatile semiconductor memory device according to claim 1, wherein the faulty block identification circuit associates the faulty block having the detected error with the redundant block and outputs a normal operation completion signal when the error is detected by the error detection circuit after shipment and it is determined that the redundant block which is not associated with the faulty block exists.

4. The nonvolatile semiconductor memory device according to claim 1 further comprising storage means for storing a faulty address identifying the faulty block therein, wherein the faulty block identification circuit stores the faulty address identifying the memory block having the detected error in the storage means when the error is detected by the error detection circuit.

5. The nonvolatile semiconductor memory device according to claim 4, wherein the faulty block identification circuit determines whether or not the faulty address is normally stored when the faulty address is stored in the storage means.

6. The nonvolatile semiconductor memory device according to claim 5, wherein the faulty block identification circuit sets a result of the determination of whether or not the faulty address is normally stored to a writing determination flag associated with the faulty address.

7. The nonvolatile semiconductor memory device according to claim 6, wherein the associating means associates the faulty block with the redundant block when the writing determination flag indicates that the faulty address is normally stored.

8. The nonvolatile semiconductor memory device according to claim 4, wherein the storage means is formed of flash memory cells.

9. The nonvolatile semiconductor memory device according to claim 1, wherein the memory cell array is formed of flash memory cells.

* * * * *